United States Patent
Su et al.

(10) Patent No.: US 6,801,435 B1
(45) Date of Patent: Oct. 5, 2004

(54) FIXING STRUCTURE FOR POWER SUPPLIES

(75) Inventors: Chun-Lung Su, Hsin-Tien (TW); Tzung-Han Lee, Hsin-Tien (TW); Hsien-Tang Weng, Hsin-Tien (TW)

(73) Assignee: Zippy Technology Corp., Taipei Hsien (TW)

( * ) Notice: Subject to any disclaimer, the term of this patent is extended or adjusted under 35 U.S.C. 154(b) by 0 days.

(21) Appl. No.: 10/437,296

(22) Filed: May 14, 2003

(51) Int. Cl.[7] .............................. H05K 5/02; H05K 5/03; H05K 7/12; E05C 1/04
(52) U.S. Cl. ..................... 361/747; 361/732; 312/222; 292/57; 292/63; 292/177
(58) Field of Search .................... 361/679, 747, 361/727–732, 686, 683, 740; 312/222, 223.2, 223.3; 248/551–553; 292/57, 62, 63, 137, 177

(56) References Cited

U.S. PATENT DOCUMENTS

| | | | | |
|---|---|---|---|---|
| 2,602,842 A | * | 7/1952 | Morris et al. | 361/726 |
| 2,788,470 A | * | 4/1957 | Giel et al. | 361/732 |
| 3,307,080 A | * | 2/1967 | Cody | 361/726 |
| 4,790,579 A | * | 12/1988 | Maxwell et al. | 292/175 |
| 4,931,907 A | * | 6/1990 | Robinson et al. | 361/727 |
| 5,465,191 A | * | 11/1995 | Nomura et al. | 361/681 |
| 5,526,226 A | * | 6/1996 | Katoh et al. | 361/680 |
| 5,717,571 A | * | 2/1998 | Helot | 361/685 |
| 5,878,608 A | * | 3/1999 | Alyanakian | 70/208 |
| 5,949,652 A | * | 9/1999 | McAnally et al. | 361/726 |
| 5,949,653 A | * | 9/1999 | Weng | 361/735 |
| 5,986,881 A | * | 11/1999 | Yang | 361/685 |
| 6,008,992 A | * | 12/1999 | Kawakami | 361/726 |
| D421,245 S | * | 2/2000 | Weng | D13/110 |
| D431,810 S | * | 10/2000 | Weng | D13/110 |
| 6,134,115 A | * | 10/2000 | Sim et al. | 361/747 |
| D435,828 S | * | 1/2001 | Chou | D13/110 |
| 6,169,661 B1 | * | 1/2001 | Lee | 361/752 |
| D445,761 S | | 7/2001 | Weng | |
| 6,256,195 B1 | * | 7/2001 | Liao | 361/685 |
| 6,327,151 B1 | * | 12/2001 | Chen et al. | 361/726 |
| D452,677 S | * | 1/2002 | Weng | D13/110 |
| D454,111 S | * | 3/2002 | Rodriguez | D13/110 |
| 6,373,707 B1 | * | 4/2002 | Hutchins | 361/725 |
| 6,430,053 B1 | * | 8/2002 | Peterson et al. | 361/728 |
| D464,027 S | | 10/2002 | Weng | |
| 6,473,313 B1 | * | 10/2002 | Chen et al. | 361/801 |
| 6,650,539 B1 | * | 11/2003 | Lin et al. | 361/690 |

FOREIGN PATENT DOCUMENTS

| | | | | |
|---|---|---|---|---|
| JP | 04006898 A | * | 1/1992 | H05K/5/00 |
| JP | 06077675 A | * | 3/1994 | H05K/7/14 |

\* cited by examiner

Primary Examiner—Anatoly Vortman
(74) Attorney, Agent, or Firm—Birch, Stewart, Kolasch & Birch, LLP

(57) ABSTRACT

An improved fixing structure for power supplies defines an accommodating area on a power supply for installing a fixing structure, and the power supply has a fixing hole on a casing of the power supply defining a limit fixing condition for the fixing structure when the power supply is pushed into the casing, and the power supply has a limit hole for installing a limit fixing member to restrict the displacement of the fixing structure, and constitutes a fixing structure that can be installed directly inside a power supply without occupying additional space, and attains the effects of fixing two fixing structures and limiting the fixing member.

4 Claims, 8 Drawing Sheets

FIXING STRUCTURE FOR POWER SUPPLIES

FIELD OF INVENTION

The present invention relates to an improved fixing structure for power supplies, more particularly to a fixing structure for safely protecting a detachable power supply.

BACKGROUND OF THE INVENTION

To prevent users from unplugging a power supply by mistake or inappropriately under the normal operation of the power supply, the existing power supplies include a fixing structure to match with a casing for plugging and unplugging; after a power supply is plugged into a casing, the fixing structure on the power supply will be latched with the casing. Unless the latch relationship of the fixing structure is released, we are unable to unplug the power supply and thus attaining the effect of safety protection.

Please refer to FIG. 1 for the R.O.C. new design patent (Publication U.S. Pat. No. D445761) entitled "Detachable Power Supply". The fixing structure of the power supply according to the design patent comprises a fixing plate extended from one side, and the fixing plate has a securing member; another fixing plate is extended outward from the casing at a position corresponding to the fixing plate. When a user pushes a power supply into the casing, the securing element is rotated into the securing hole on the fixing plate to define a fixing relationship. However, such design requires a fixing plate extended from the power supply and the casing for the connection, which is a waste of limited available space.

To overcome the shortcoming of the previous design, the R.O.C. new design patent (Publication U.S. Pat. No. D4640275) entitled "1U Horizontal Tolerance Power Supply" disclosed a power supply having an elastic fixing plate which is corresponsive to a fixing hole on a protrusion of the casing, and such design does not require an additional fixing plate and can effectively save space. However, since the elastic fixing plate only requires a small force to release the latch relationship of the power supply, therefore users may easily detach the power supply by mistake particularly when it is used together with a handle. Therefore, such design has a safety protection effect poorer than the previous securing design by means of the securing element.

SUMMARY OF THE INVENTION

The primary objective of the present invention is to solve the aforementioned problems and eliminate the drawbacks of cited prior art. The present invention combines the advantages of the previous two designs to provide a fixing structure that does not require additional space for the fixing plate but provides a safety protection effect by a securing element. An accommodating area is defined on a power supply, and the power supply has a fixing hole at a position corresponding to the casing for accommodating the power supply and defining a fixing condition when the power supply is pushed into the casing. A limit hole is disposed on the power supply corresponding to a fixing member for restricting the displacement of the fixing structure. These components constitute a fixing structure installable inside the power supply without requiring additional installation space, and attain the safety effects for securing the fixing structure and restricting the fixing member.

DETAILED DESCRIPTION OF THE PREFERRED EMBODIMENTS

Figure 1:
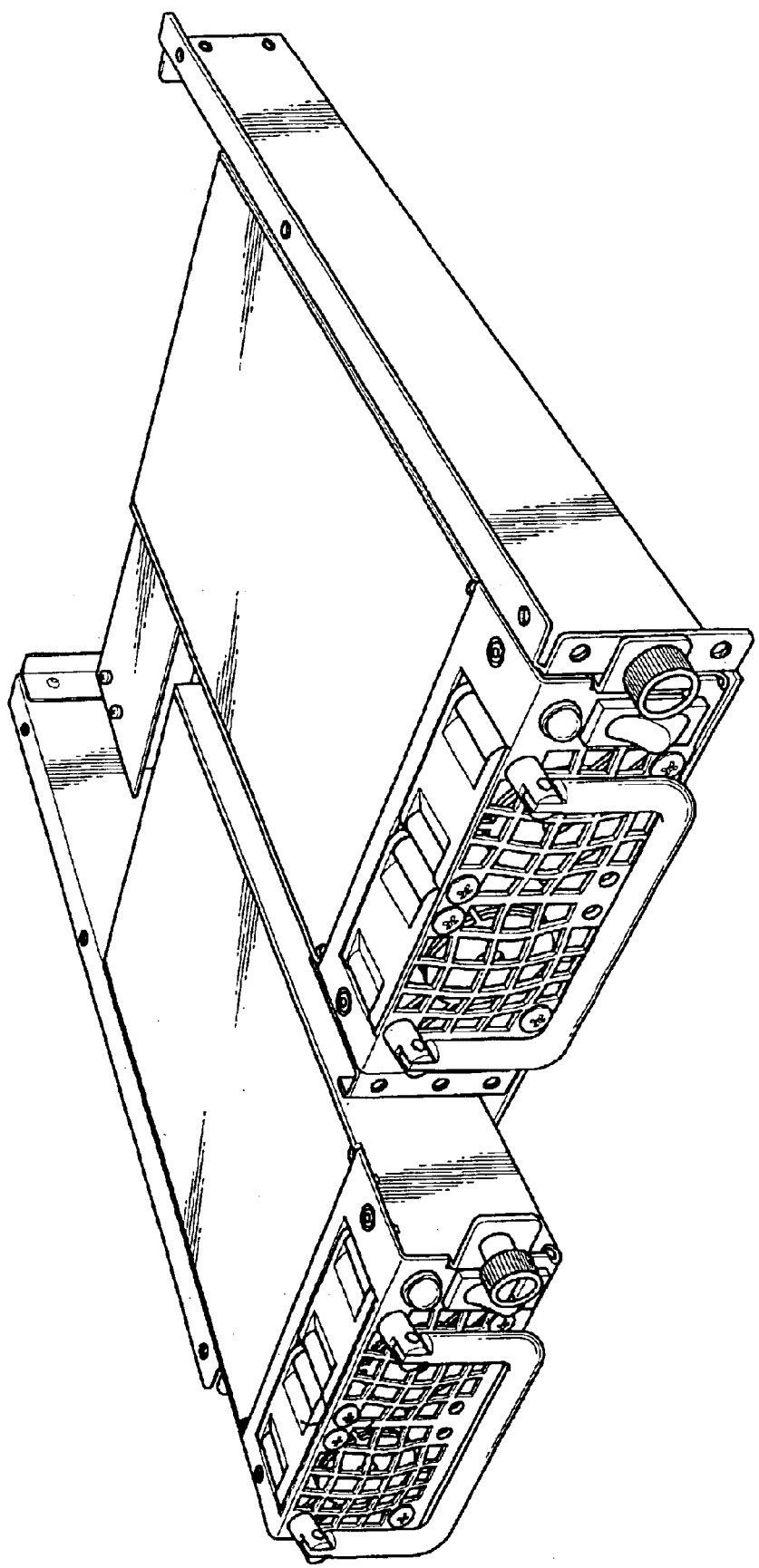
FIG. 1 is a perspective diagram of a prior-art power supply.
Figure 2:
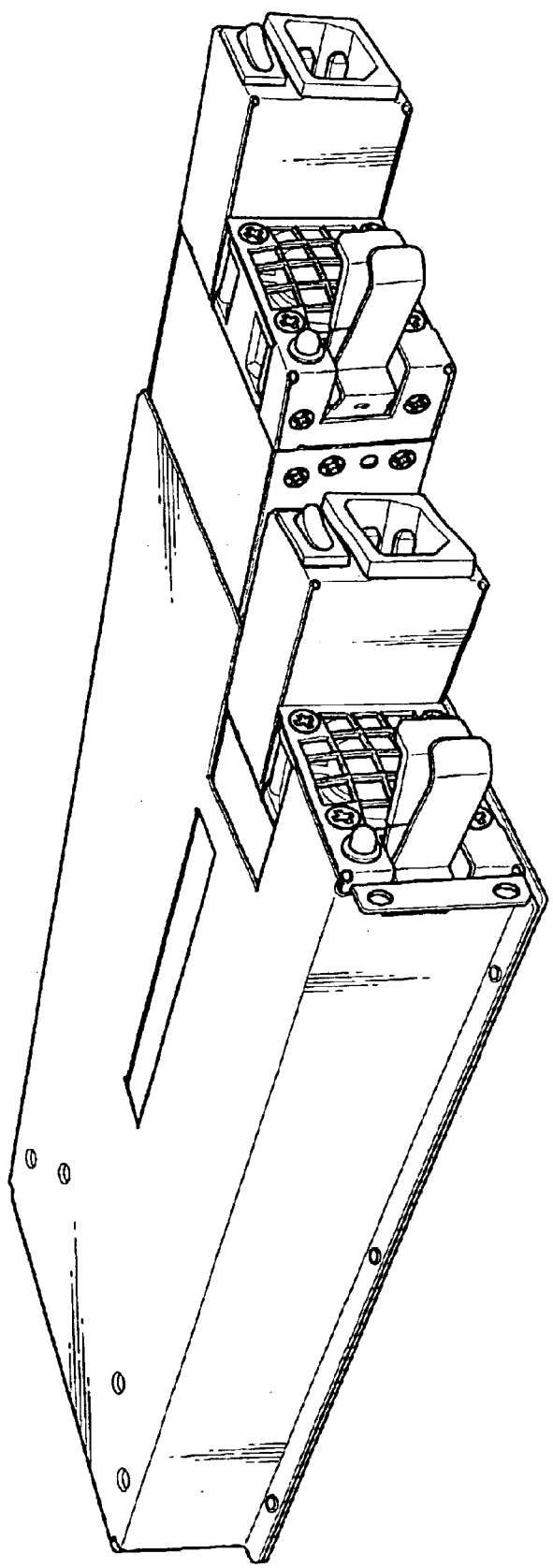
FIG. 2 is a perspective diagram of another prior-art power supply.
Figure 3:
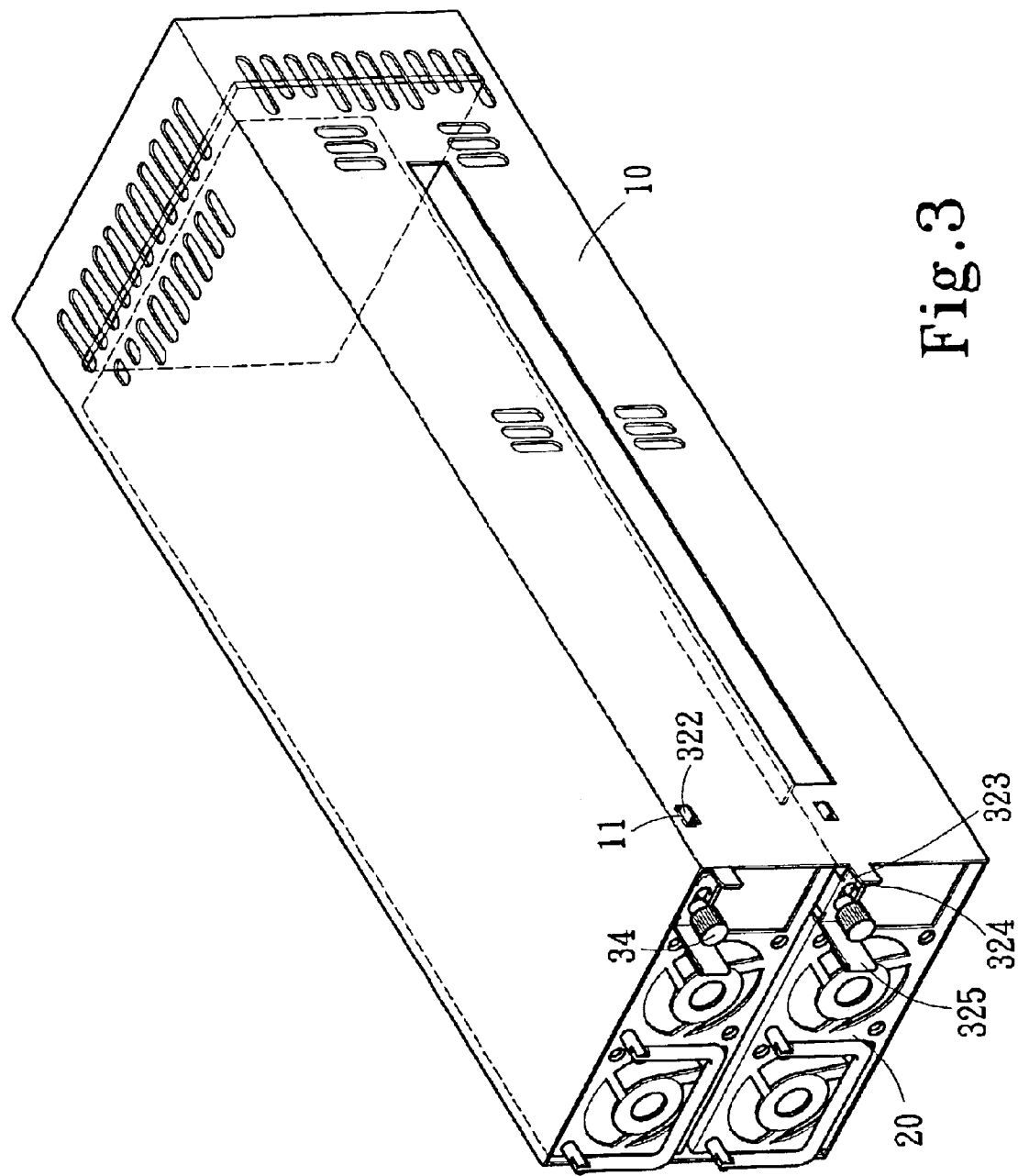
FIG. 3 is a perspective diagram of a power supply according to the present invention.
Figure 4:
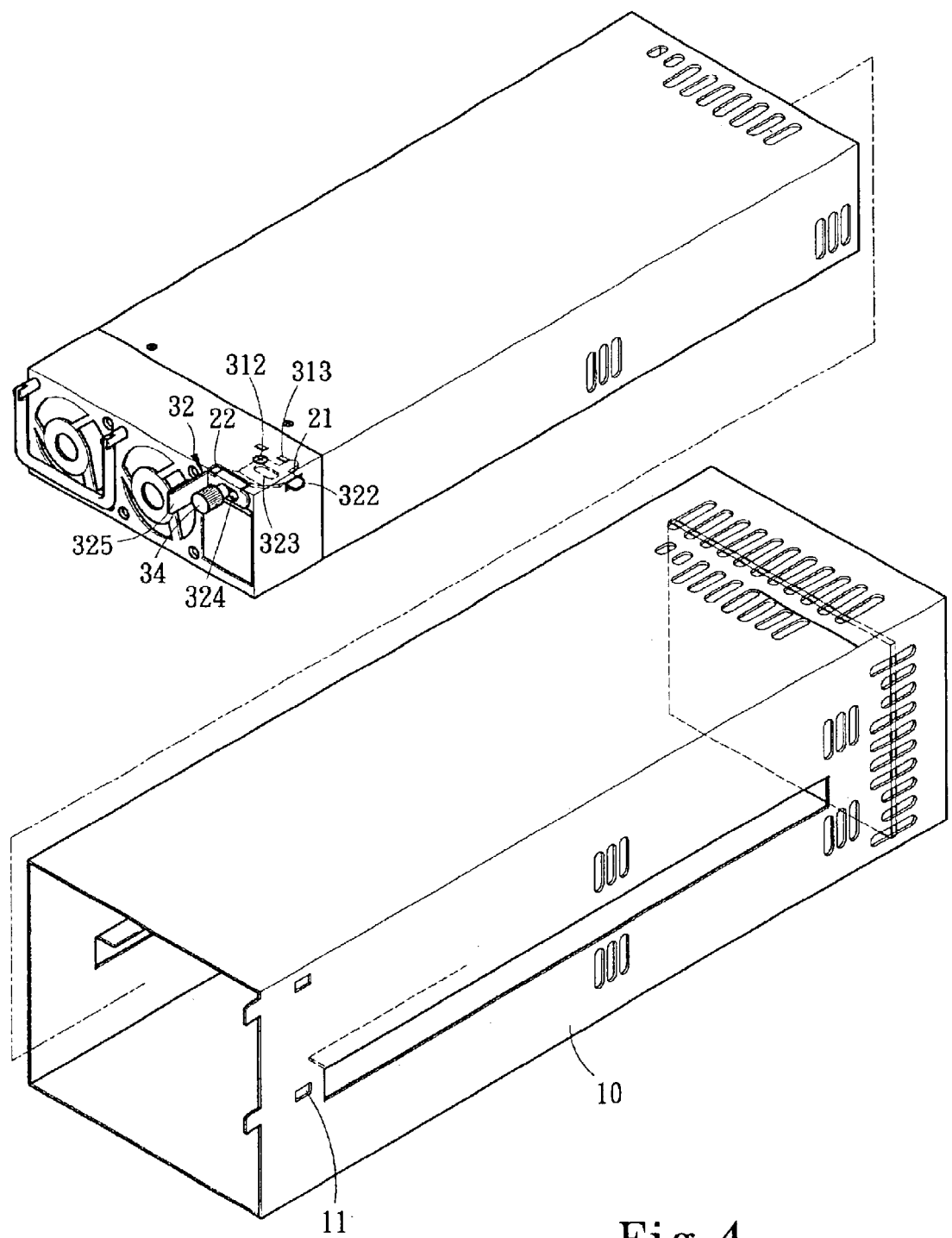
FIG. 4 is an illustrative diagram of the disassembled parts of the structure of the present invention.

The detailed description of the present invention and its technical contents are illustrated together with the drawings as follows. Please refer to FIGS. 3, 4 and 5 for the perspective diagram of the present invention and the illustrative diagrams of its disassembled parts. In the figures, a power supply 20 of the present invention defines an accommodating area 22 for receiving a fixing structure, and the power supply 20 has a fixing hole 11, 21 corresponding to a casing 10 that accommodates the power supply 20. A limit hole 23 is disposed on the power supply 20, and the foregoing fixing structure includes a base member 31 having a fixing hole 311 and being coupled by a connecting member 312 and a base member 31. The base member 31 at the position corresponding to the power supply 20 has a protruded pillar 313 and a through hole 24 for facilitating the positioning during the assembling. A fixing member 32 is disposed on the accommodating area 22 on the power supply 20, and the fixing member 32 has a displacement hole 321 on the connecting member 312 for passing the connecting member 312 through. A fixing ear 322 is disposed at the fixing hole 11, 21 exposed and extended from the displacement hole 321; a limit section 323 has a limit hole 324 with the same traveling displacement as the displacement hole 321; a fixing member 34 with the displacement of a limit fixing member 32 is coupled to a limit hole 23 at the position of the limit hole 324; and an exerting section 325 is disposed on one side of the limit section 323. In addition, the fixing structure further comprises an elastic member 33 coupled to the base member 31 and providing the elasticity for resuming the free status, and the base member 31 has an accessory hole 314 disposed on the base member 31 for adjusting the displacement with the same function of the displacement hole 321. The displacement hole 321 of the fixing member 32 extends a support section 326 towards the accessory hole 314.

Figure 5:
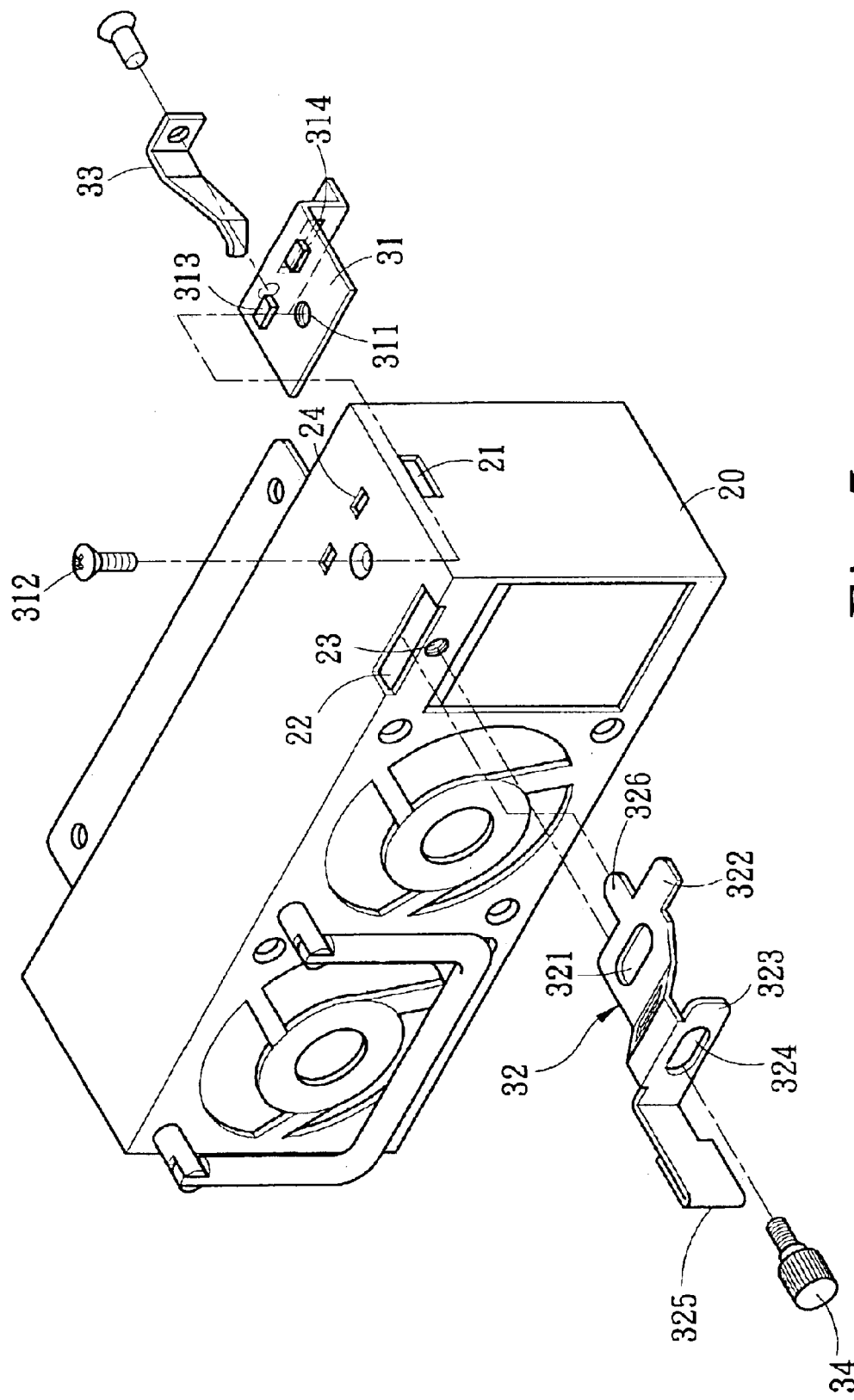
FIG. 5 is an illustrative diagram of the disassembled parts of the fixing structure of the present invention.
Figure 6A:
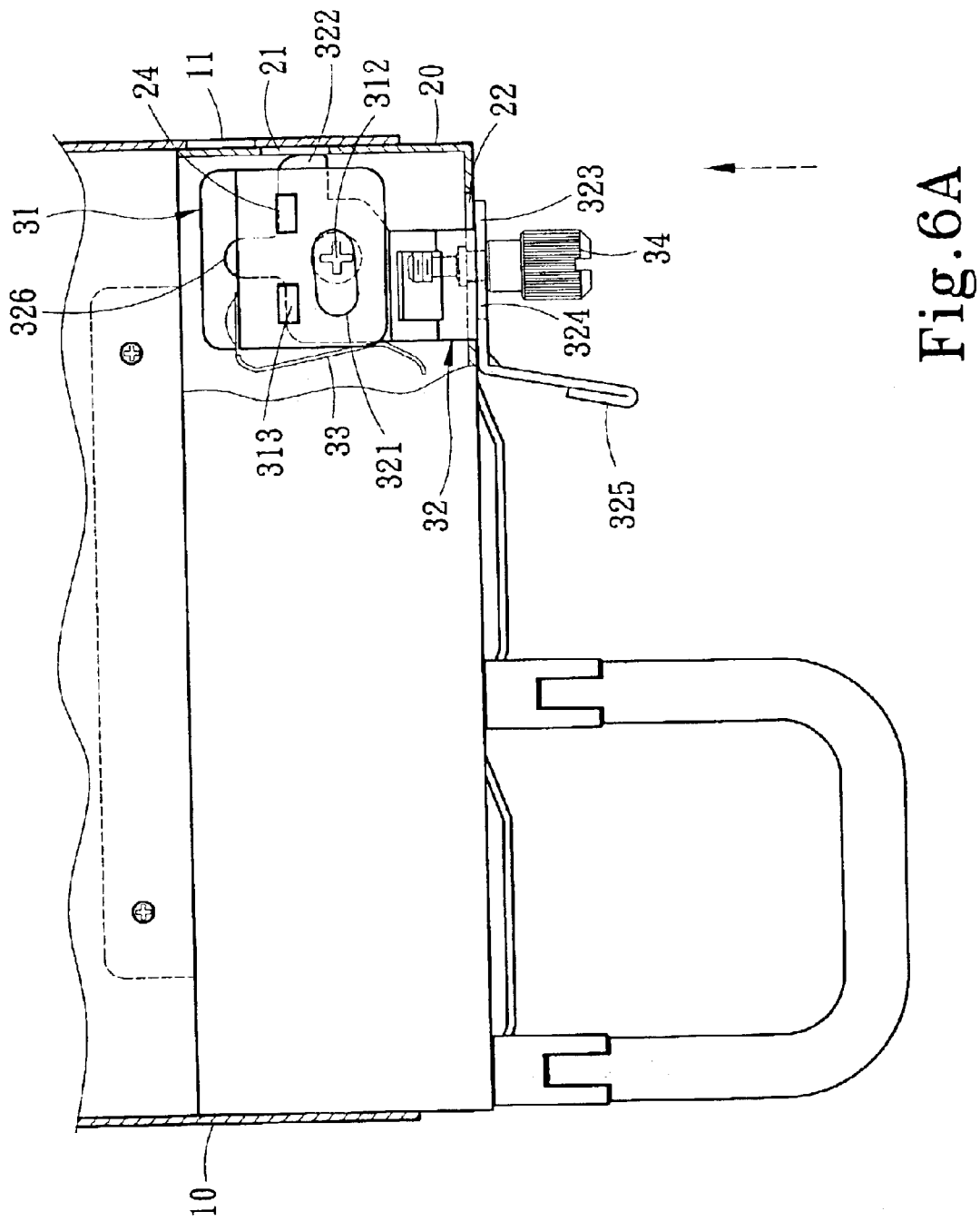
FIGS. 6A and 6B are illustrative diagrams of the movement of the fixing structure according to the present invention.
Figure 6B:
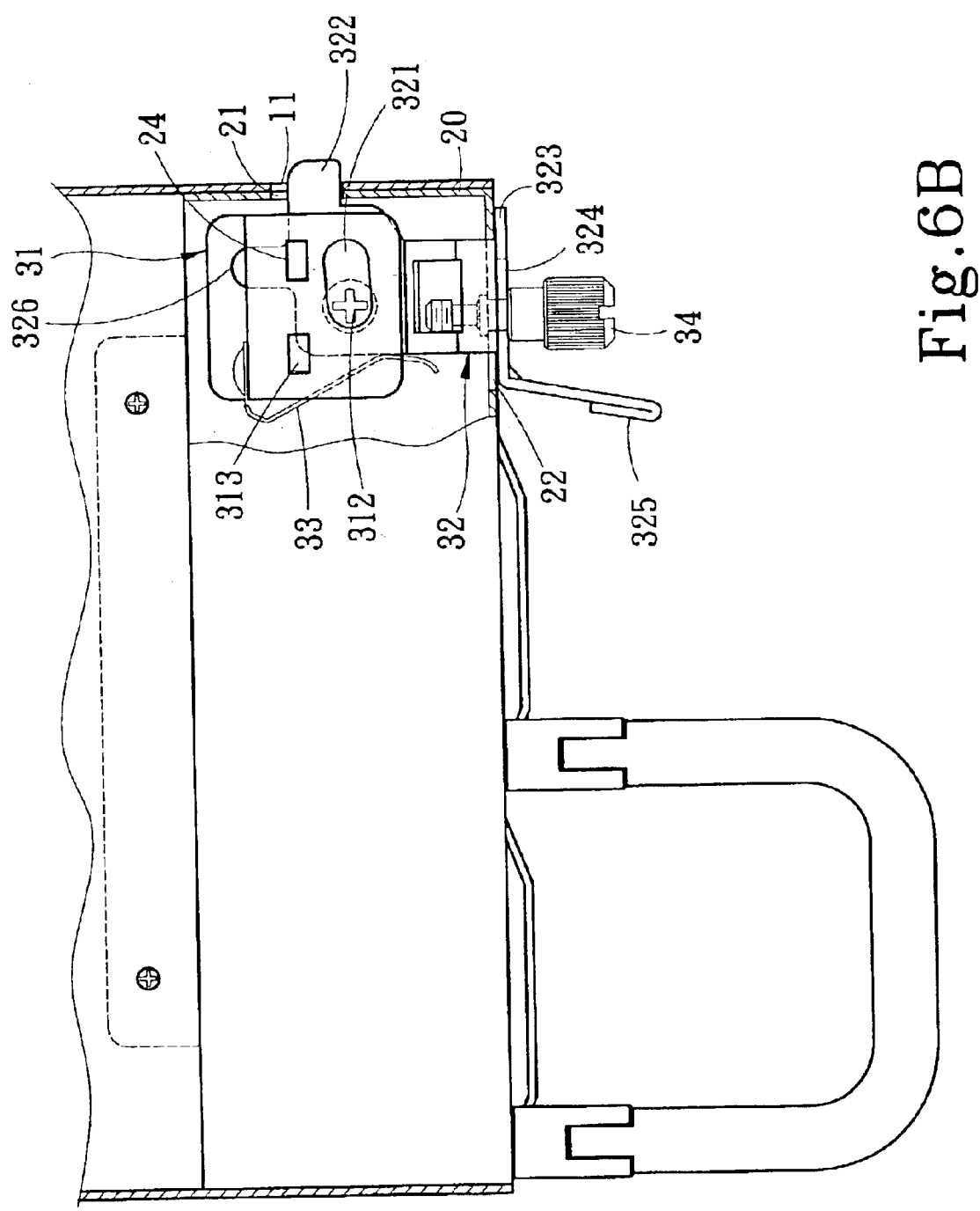

Please refer to FIGS. 5 and 6A for the illustrative diagrams of the disassembled parts of the fixing structure of the present invention and its movement respectively. In the figures, the status of limiting the displacement of the fixing member 32 by the fixing member 34 is released first. When the power supply 20 is pushed into the casing 10, since the fixing ear 322 has a guide angle design on its periphery, therefore the fixing ear 322 will continue receiving forces and drive the whole fixing member 32 to move inward and then the fixing member 32 will squeeze the elastic member 33 to store elastic force. When the power supply 20 is completely pushed into the casing 10, the fixing ear 322 will successfully enter into the fixing hole 11, 21 of the casing 10 to define a latch. In FIG. 6B, the fixing member 34 is rotated to press against the limit section 323 of the fixing member 32 to provide another effective safety protection.

When users detach the power supply 20, the power supply 20 cannot be detached directly. The user has to release the displacement status of the limit member 32 by the fixing member 34, and then exerts a force onto the exerting section 325 of the fixing member 32 to move it to the left side, such that the fixing ear 322 is separated from the latch status of the fixing hole 11 of the casing 10 in order to detach the power supply 20.

In addition, since the traveling displacements of the displacement bole on the fixing member 32, the accessory hole 314 of the connecting member 312 and the base member 31, the support section 326 of the fixing member 32, the limit hole 324 and the fixing member 34 are the same, and the direction and traveling distance of the displacement of the fixing member 32 are maintained by three points simultaneously, so that the fixing member 32 will not skew due to external forces.

Figure 7:
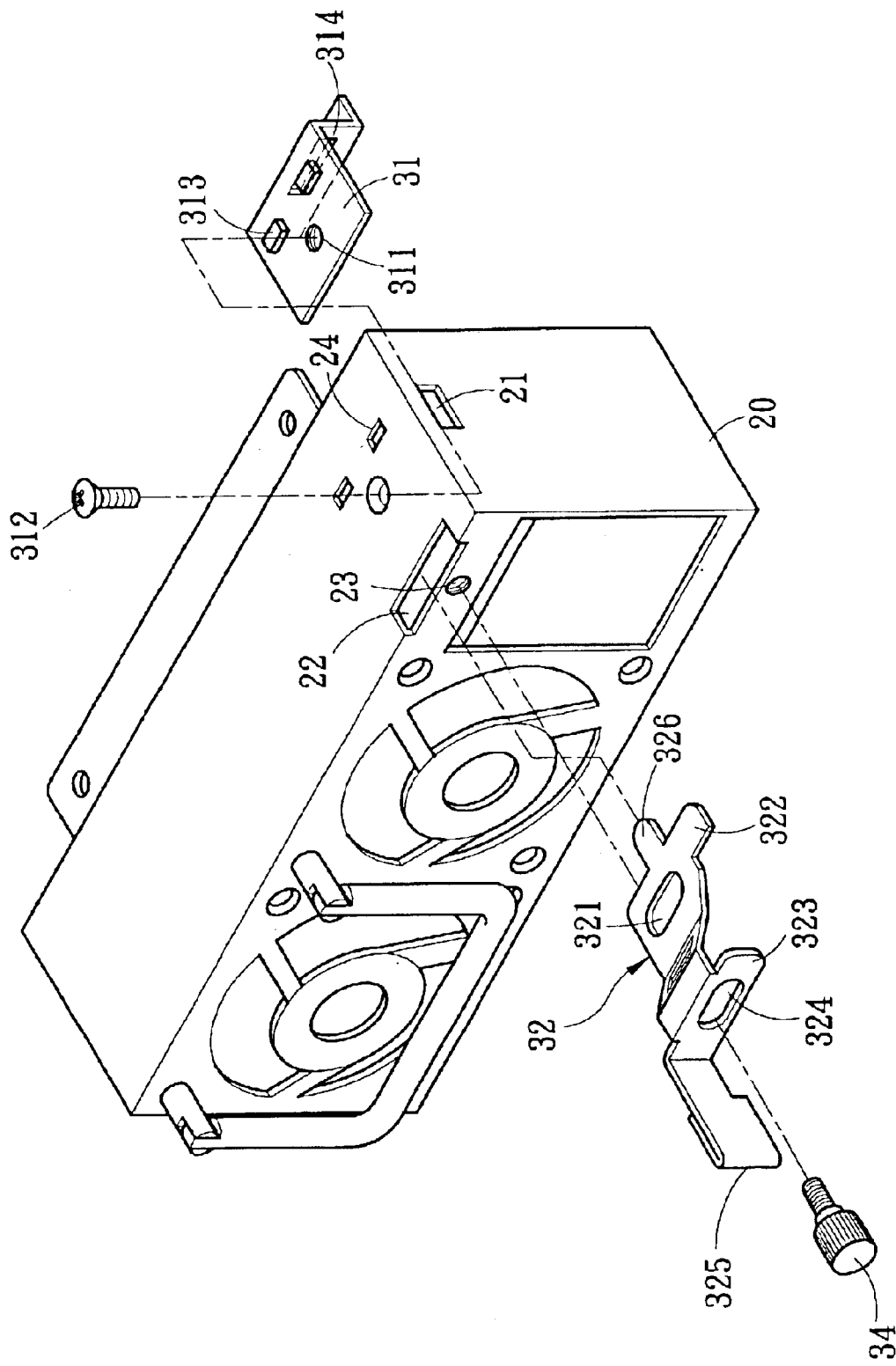
FIG. 7 is an illustrative diagram of the disassembled parts of the fixing structure according to another preferred embodiment of the present invention.

Please refer to FIG. 7 for the illustrative diagram of the disassembled parts of the fixing structure according to another preferred embodiment of the present invention. In the figure, the differences between its implementation and aforementioned methods reside on that the space allocation of the interior of the power supply 20 is taken into consideration and the elastic member 33 for the automatic restoration of elasticity is omitted. When users push the power supply 20 into the casing 10, the exerting section 325 is pushed to the right side manually that allows the fixing ear 322 to enter into the fixing hole 11 of the casing 10 to define the latch condition, and then the fixing member 34 is rotated and engaged with the limit section 323 of the fixing member in order to provide the safety protection.

What is claimed is:

1. An improved fixing structure for power supplies, defining an accommodating area on a power supply for installing a fixing structure, and the power supply having a corresponsive fixing hole on a casing of the power supply and the power supply having a limit hole, comprising:

a base member, having a fixing hole and being coupled with the power supply by a connecting member;

a fixing member, disposed on said accommodating area of said power supply, and having a displacement hole disposed at the position of said connecting member for passing said connecting member through, and having a fixing ear extended from said displacement hole and disposed at said exposed fixing hole, and said displacement hole having a limit section with a limit hole having the traveling distance same as that of the displacement hole extended from said displacement hole and disposed at said exposed accommodating area, and an exerting section being disposed on one side of said limit section; and a fixing member, passing through and being coupled to said limit hole for restricting the displacement of said fixing member.

2. The improved fixing structure for power supplies of claim 1, wherein said base member comprises an accessory hole with the same adjusted traveling distance of the displacement of said displacement hole, and a support section extended from said displacement hole of said fixing member towards said accessory hole.

3. The improved fixing structure for power supplies of claim 1, further comprising an elastic member coupled with said base member for providing a free elastic restoration status for said fixing member.

4. The improved fixing structure for power supplies of claim 1, wherein said base member comprises a protruded pillar and a through hole corresponding to said power supply.

* * * * *